(12) United States Patent
Megason

(10) Patent No.: US 7,723,621 B2
(45) Date of Patent: May 25, 2010

(54) FLEXIBLE GASKET

(75) Inventor: George D Megason, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1 day.

(21) Appl. No.: 12/124,670

(22) Filed: May 21, 2008

(65) Prior Publication Data

US 2008/0296850 A1 Dec. 4, 2008

Related U.S. Application Data

(60) Provisional application No. 60/941,879, filed on Jun. 4, 2007.

(51) Int. Cl.
*H05K 9/00* (2006.01)

(52) U.S. Cl. ...................... 174/354; 174/355

(58) Field of Classification Search ................ 174/354, 174/355, 369; 361/816, 818; 439/607.19, 439/607.54

See application file for complete search history.

(56) References Cited

U.S. PATENT DOCUMENTS

| | | | | | |
|---|---|---|---|---|---|
| 5,511,798 | A | * | 4/1996 | Kawamoto et al. | 277/647 |
| 5,564,930 | A | * | 10/1996 | Yu | 439/61 |
| 5,684,271 | A | * | 11/1997 | Scholder et al. | 174/382 |
| 5,742,003 | A | * | 4/1998 | Ho | 174/372 |
| 5,838,550 | A | * | 11/1998 | Morris et al. | 361/818 |
| 6,061,249 | A | * | 5/2000 | Nealis | 361/785 |
| 6,166,325 | A | * | 12/2000 | Wu | 174/377 |
| 6,280,257 | B1 | * | 8/2001 | North et al. | 439/680 |
| 6,339,536 | B1 | * | 1/2002 | Buican et al. | 361/818 |
| 6,420,009 | B1 | * | 7/2002 | Cheng | 428/99 |
| 6,709,291 | B1 | * | 3/2004 | Wallace et al. | 439/607.01 |
| 6,822,879 | B2 | * | 11/2004 | Rathnam et al. | 361/818 |
| 2008/0060842 | A1 | * | 3/2008 | Barringer et al. | 174/354 |

* cited by examiner

*Primary Examiner*—Hung V Ngo

(57) ABSTRACT

Included are embodiments of a gasket system. At least one embodiment of the gasket system includes a circuit enclosure and a 1-piece gasket, the 1-piece gasket including a plurality of tabs for the 1-piece gasket, the plurality of tabs configured for securing the 1-piece gasket with an aperture, the 1-piece gasket formed from a single piece of material.

20 Claims, 4 Drawing Sheets

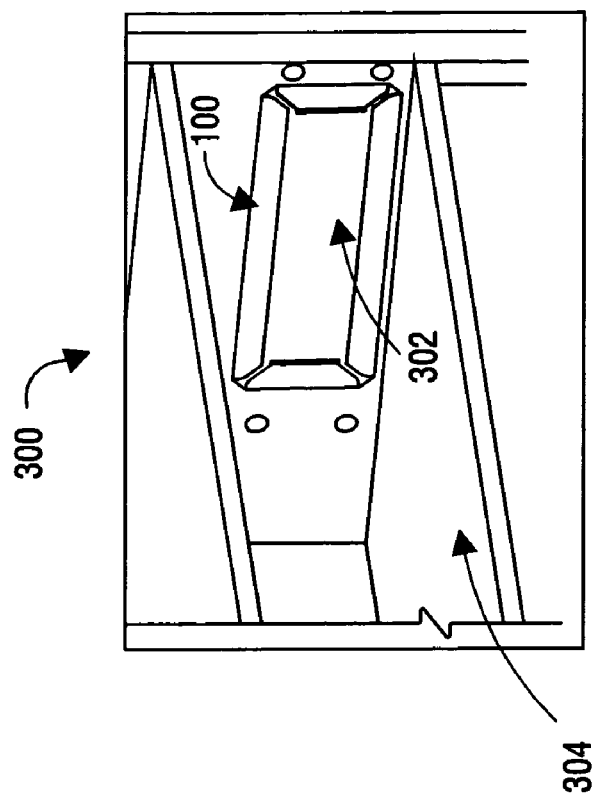
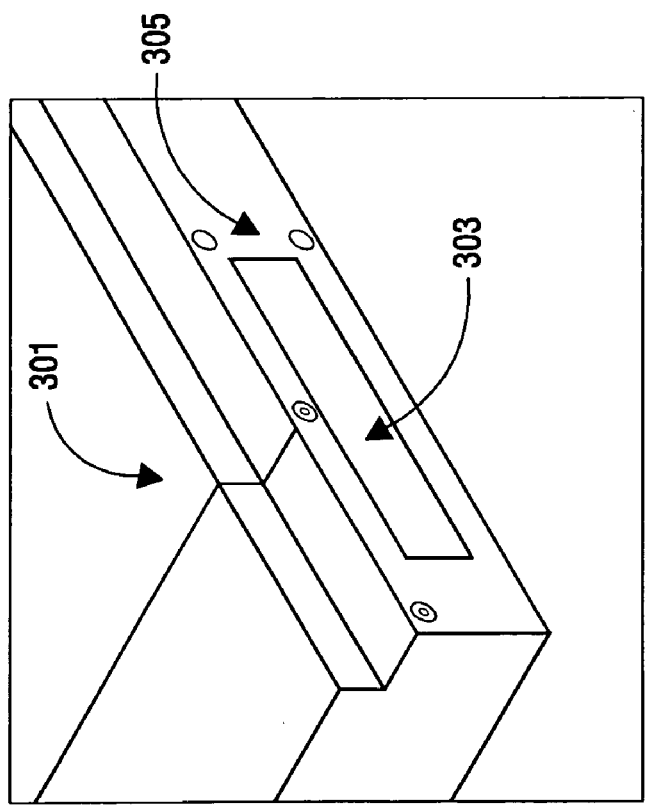

FLEXIBLE GASKET

CROSS REFERENCE

This application claims the benefit of U.S. Provisional Application No. 60/941,879, filed Jun. 4, 2007, which is incorporated by reference in its entirety.

BACKGROUND

Metal gaskets are currently used in enclosures that house electrical devices. These gaskets may be designed to keep unwanted electromagnetic interference (EMI) from escaping and in some designs can limit the amount of air that can pass through the gasket. Additionally, fabric and/or foam based gaskets can be cut to profile and surround openings that pass air from one enclosure to another. When a user utilizes a robust, flexible single piece gasket as a seal between two sheet metal enclosures that must slide together to line up openings through which air will pass from one enclosure to another, these solutions may not perform as desired. Additionally, many current flexible metal gaskets are designed to withstand sliding forces in one axis, so they cannot be used to surround an opening. Additionally, these gaskets are typically not robust enough to withstand the substantial forces generated when one sheet metal enclosure is plugged into another. The fabric and/or foam gaskets can provide adequate seal around an opening, but they may not be robust enough to withstand repeated insertions of the sheet metal enclosure.

SUMMARY

Included are embodiments of a gasket system. At least one embodiment of the gasket system includes a circuit enclosure and a 1-piece gasket, the 1-piece gasket including a plurality of tabs, the plurality of tabs configured for securing the 1-piece gasket with an aperture, the 1-piece gasket formed from a single piece of material.

Also included are embodiments of an apparatus. At least one embodiment includes a front sealing portion, a back sealing portion and an inner securing portion including tabs substantially perpendicular to the back sealing portion, the tabs extending from the back sealing portion a specific distance and angling away from the inner portion, the specific distance determined by the thickness of a circuit enclosure onto which the apparatus may be coupled.

Also included are embodiments of a method. At least one embodiment of a method includes forming at least one side for a 1-piece gasket and forming a plurality of tabs for the 1-piece gasket, the plurality of tabs configured for securing the 1-piece gasket with an aperture.

Other embodiments and/or advantages of this disclosure will be or may become apparent to one with skill in the art upon examination of the following drawings and detailed description. It is intended that all such additional systems, methods, features, and advantages be included within this description and be within the scope of the present disclosure.

BRIEF DESCRIPTION

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

FIGS. 3A and 3B depict an exemplary embodiment of a circuit enclosure with at least one aperture for utilizing a gasket, such as the gasket from FIGS. 1 and 2.

DETAILED DESCRIPTION

Included are embodiments of a flexible, robust, single piece gasket that can withstand abrasion of sharp corners as two enclosures slide in relation to one another and provide adequate EMI and air leakage control. More specifically, embodiments disclosed herein include a robust gasket that can seal around an opening in two mating sheet metal enclosures and yet allow air to pass from one enclosure to the other without allowing undesirable leakage of air or electromagnetic emissions. Similarly, embodiments of the gasket may be designed in such a way that when the two enclosures slide in relation to one another, the gasket will not be damaged.

Thin metallic, fabric and/or foam or elastomer-based gaskets are used as a sealseal between two sheet metal surfaces. These current solutions do not address the specific needs filled by the embodiments being described herein. Fabric and/or foam or elastomer-based gaskets are prone to damage from edges of the mated enclosures. They also can be damaged or deteriorate due to airflow, particularly when that airflow includes high temperatures or abrasive particles.

Embodiments of the gasket may be four-sided and may be formed from a single piece of metal. In at least one embodiment, this metal is stainless with a thickness of approximately 0.006 inches. Similarly, some embodiments may utilize different thicknesses. Still some embodiments may use other metals, or other materials with similar ware, stiffness, flexibility, and/or other similar structural characteristics and mechanical properties. Because of the specific design application, some embodiments may be configured as a rectangular gasket, which is flexible, and without edges and/or corners that can snag from any direction. Some embodiments may also allow for easy insertion or removal of the gasket. Other embodiments may be configured as other shapes such as circular and/or oblong. Still some embodiments may be irregular shapes specifically tailored to the shape of the openings to be joined. Similarly, some embodiments are configured for durability and flexibility and at the same time are able to seal around an opening to prevent undue leakage of EMI and/or air.

Figure 1:
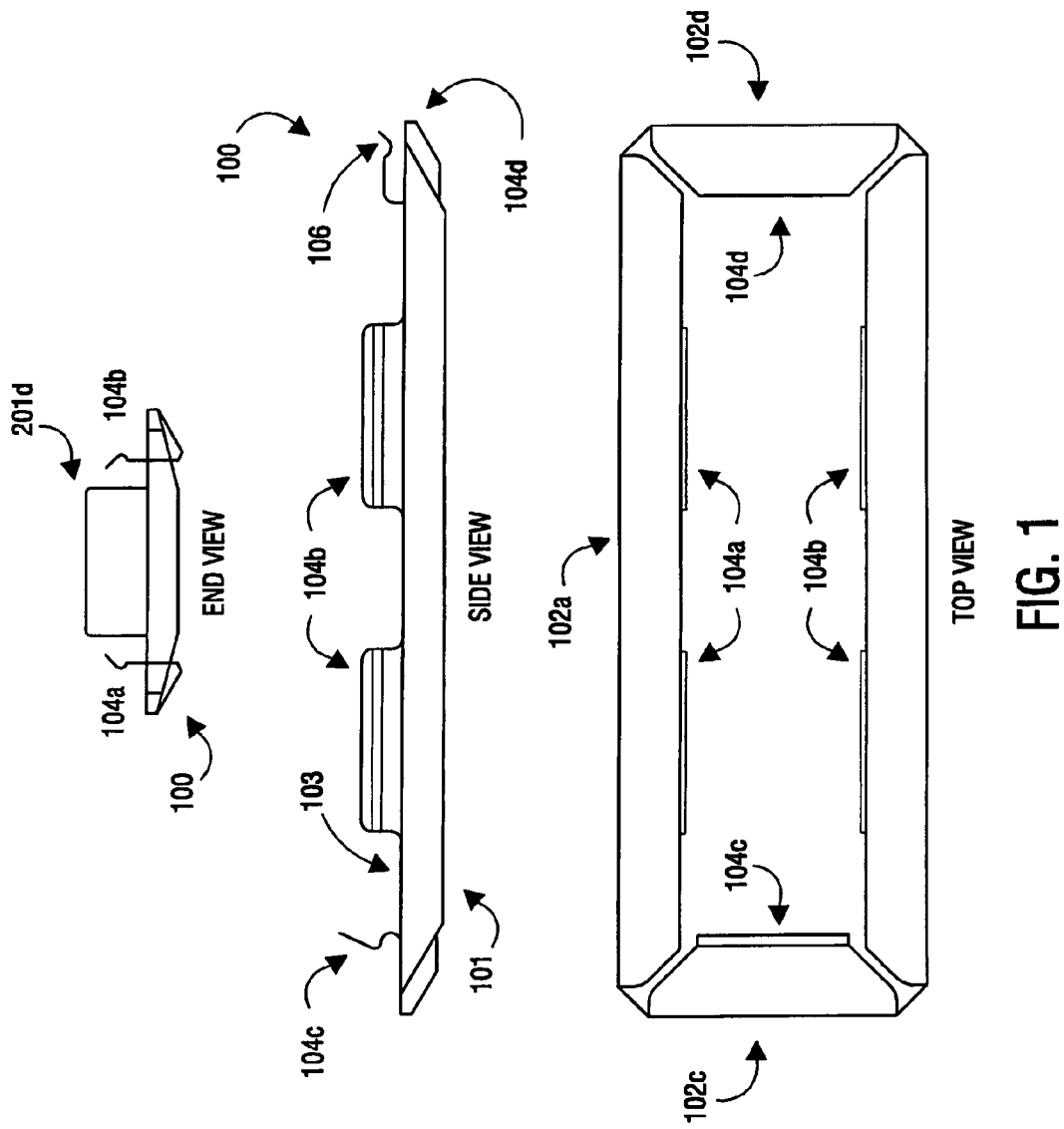
FIG. 1 depicts an exemplary embodiment of a gasket for reducing EMI and/or air leakage.

Referring now to the drawings, FIG. 1 depicts an exemplary embodiment of a gasket 100 for reducing EMI and/or air leakage. More specifically, as illustrated in the nonlimiting example of FIG. 1, the gasket 100 may include a front sealing portion 101 and a back sealing portion 103, which may be configured to seal the gasket 100 with an aperture to prevent leakage of EMI and/or air. Also included are a first side 102a, a second side 102b, a third side 102c, and a fourth side 102d. As discussed above, the gasket 100 may be formed from a single piece of metal (and/or other material) and may include an inner securing portion that includes tabs 104a, 104b, 104c, and 104d. Tabs 104a and 104b, which are illustrated in the side view, may extend perpendicular to the side 102a and 102b, respectively. The tabs 104a and 104b may include ridges and/or other mechanisms for helping to secure the gasket in an aperture, as discussed with regard to FIG. 3. Similarly, the tabs 104a and 104b may extend a predetermined distance from the back sealing portion 103 of the gasket 100 and may be configured at an angle from perpendicular to sides 102a and 102b to facilitate securing of the gasket 100 in an aperture.

Also included in the nonlimiting example of FIG. 1, are tabs 104c and 104d, which may be coupled to sides 102c and 102d, respectively. The tab 104c may be configured in a roughly "S" shape, extending roughly perpendicularly to the side 102c. The "S" shape of the tab 104c may be configured to facilitate securing the gasket 100 in an aperture, as discussed below. Similarly, the tab 104d may be configured to extend in roughly the same direction as the side 102d. Additionally, the tab 104d may be configured with a crimped portion 106 to facilitate securing the gasket 100 in an aperture, as discussed below. One should note that the shape, size, and/or direction of the tabs may depend on the thickness of the circuit enclosure that the gasket 100 is to be attached.

Figure 2:
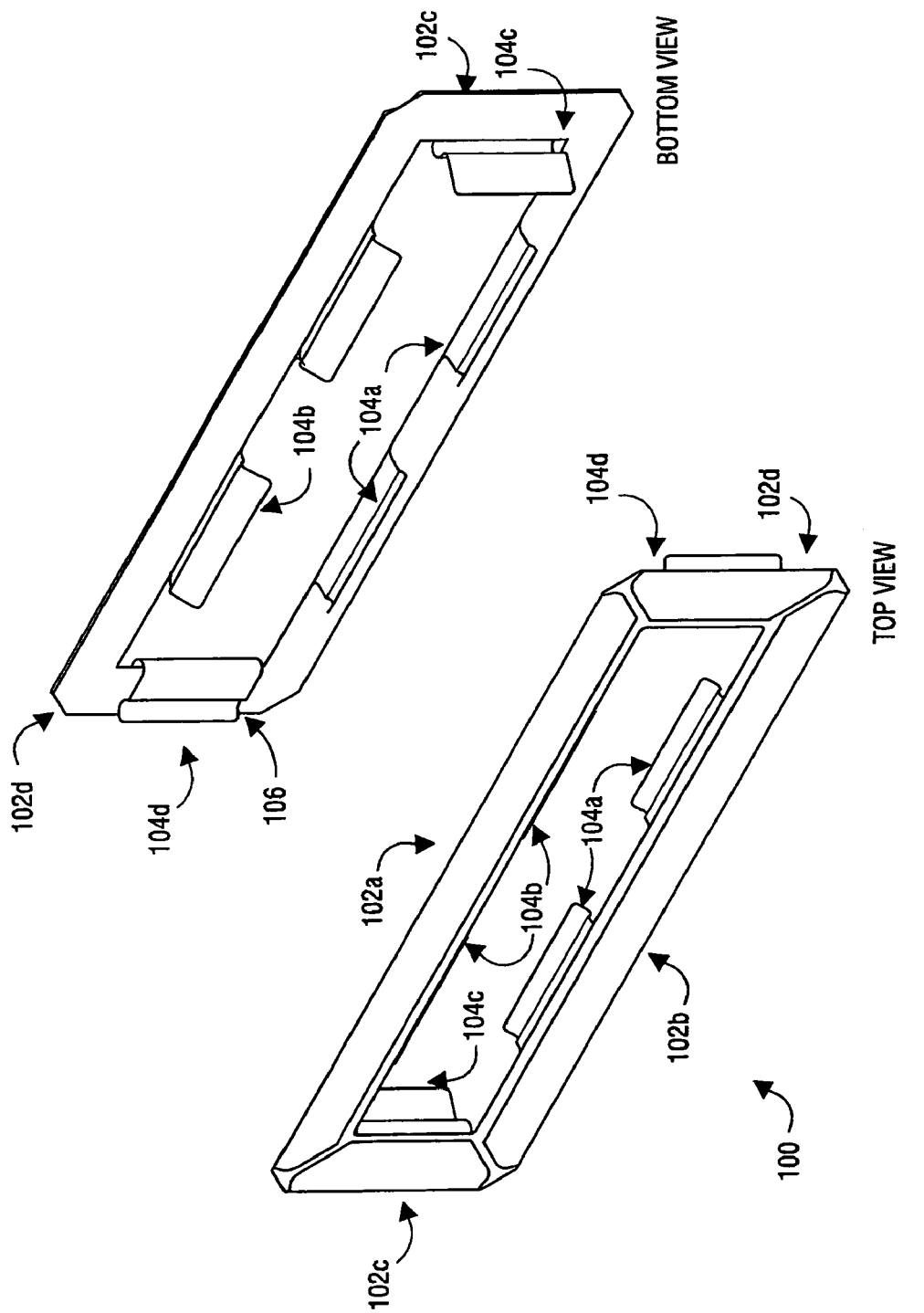
FIG. 2 depicts an exemplary embodiment of the gasket from a plurality of perspective views, similar to the diagram from FIG. 1.

FIG. 2 depicts an exemplary embodiment of the gasket 100 from a plurality of perspective views, similar to the diagram from FIG. 1. As illustrated in the nonlimiting example of FIG. 2, the tabs 104a, 104b, 104c, 104d may be formed from the same piece of material as the rest of the gasket 100. Additionally, the tabs 104a and 104b may be configured with crimps, grading and/or other formations to facilitate securing the gasket 100 in an aperture. Similarly, the tab 104c may be configured roughly in an "S" shape and extend perpendicularly from the side 102c. The tab 104d may be configured to extend in a similar direction as the side 102d, with a crimp 106 for facilitating securing of the gasket 100 in an aperture.

FIG. 3A depicts an exemplary embodiment of a slot 304 in a circuit enclosure 300 for receiving one or more module 301, as shown in FIG. 3B. Each slot 304 in the circuit enclosure 300 may include a first aperture 302 for receiving a gasket, such as the gasket 100 from FIGS. 1 and 2. More specifically, the gasket 100 (illustrated as being inserted into an aperture 302 in FIG. 3A) may be configured such that the tabs 104a, 104b, 104c, and 104d are inserted into the first aperture 302. Upon being inserted into the first aperture 302, the tabs 104a, 104b, 104c, and 104d may be configured to secure the gasket 100 such that the sides 102a, 102b, 102c, and 102d may be flush against a side of the circuit enclosure 300.

FIG. 3B illustrates a module 301 with a second aperture 303, which may be inserted into the slot 304 from FIG. 3A. When the module 301 is inserted into slot 304 of the circuit enclosure 300, the first aperture 302 and the second aperture may substantially align, such that the gasket 100 (which has been inserted into first aperture 302 of the circuit enclosure 300) seals against surface 305 of module 301, thereby preventing and/or reducing EMI and air leakage.

Figure 4:
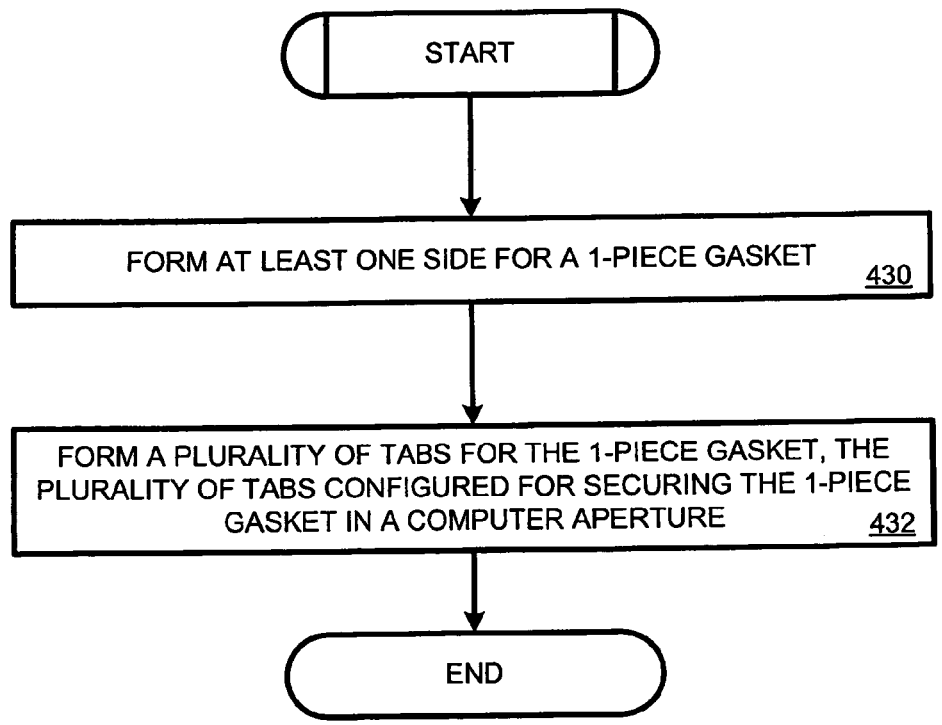
FIG. 4 depicts an exemplary embodiment of a process that may be utilized in creating a 1-piece gasket, such as the gasket from FIGS. 1-3.

FIG. 4 depicts an exemplary embodiment of a process that may be utilized in creating a 1-piece gasket, such as the gasket 100 from FIGS. 1-3. As illustrated in the nonlimiting example of FIG. 4, the gasket 100 may be creating by forming at least one side 102 for the 1-piece gasket (block 430). Additionally, a plurality of tabs may be formed for the 1-piece gasket. In at least one embodiment, the plurality of tabs may be configured for securing the 1-piece gasket in an aperture (block 432).

One should also note that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

It should be emphasized that the above-described embodiments are merely possible examples of implementations, merely set forth for a clear understanding of the principles of this disclosure. Many variations and modifications may be made to the above-described embodiment(s) without departing substantially from the spirit and principles of the disclosure. All such modifications and variations are intended to be included herein within the scope of this disclosure.

Therefore, at least the following is claimed:

1. A gasket, comprising:
   a front sealing portion;
   a back sealing portion; and
   an inner securing portion including:
      a first number of tabs arranged on opposite sides of the gasket and configured to have a straight portion extending a specific distance from the back sealing portion substantially perpendicular to the back sealing portion, the first number of tabs having a crimped portion beyond the specific distance and an end angling away from the inner portion, the specific distance determined by the thickness of a circuit enclosure onto which the gasket may be coupled,
      a second number of tabs arranged on a side of the gasket different from the sides on which the first number of tabs are arranged, the second number of tabs extending a distance from the back sealing portion substantially perpendicular to the back sealing portion, thereafter having an approximately 90 degree bend to a flat portion extending substantially parallel to the back sealing portion and a crimped portion beyond the flat portion, and
      a third number of tabs arranged on a side of the gasket opposite the second number of tabs and configured in an s shape,
      wherein the gasket is formed from a single piece of material.

2. The gasket of claim 1, wherein the third number of tabs include a crimped portion, the crimped portion forming a part of the s shape.

3. The gasket of claim 1, wherein the gasket is configured to reduce electromagnetic interference (EMI) and air leakage.

4. The gasket of claim 1, wherein the gasket is configured in a rectangular configuration.

5. The gasket of claim 1, wherein the front sealing portion includes a plurality of sides, each of the plurality of sides including a respective length that defines the length of the gasket, each of the plurality of sides including a front portion that is substantially flat with a substantially uniform width along the entirety the respective length.

6. The gasket of claim 1, wherein each of the first, second, and third number of tabs includes a first bend in one direction and a second bend in an opposing direction.

7. The gasket of claim 1, wherein the gasket includes two short sides, one of the two short sides including a single second number of tabs, the other of the two short sides including a single third number of tabs, and two long sides, each long side including two independent tabs of the first number of tabs.

8. A method, comprising:
   forming a 1-piece gasket from a single piece of material; and
   forming a plurality of tabs for the 1-piece gasket, the plurality of tabs configured for securing the 1-piece gasket with an aperture,
   wherein at least one of the tabs is configured in an s shape and at least one of the tabs is configured to have a portion substantially perpendicular to a sealing portion of the 1-piece gasket coupled to an approximately 90 degree bend coupled to a flat portion extending substantially parallel to the sealing portion of the 1-piece gasket coupled to a crimped portion.

9. The method of claim 8, wherein forming the at least one of the tabs in the s shape includes forming a crimped portion.

10. The method of claim 8, wherein the 1-piece gasket is configured to reduce electromagnetic interference (EMI) and air leakage.

11. The method of claim 8, wherein the 1-piece gasket is configured in a rectangular configuration.

12. The method of claim 8, wherein the 1-piece gasket includes a front sealing portion that includes a plurality of sides, each of the plurality of sides including a respective length that defines the length of the apparatus, each of the plurality of sides including a front portion that is substantially flat with a substantially uniform width along the entirety the respective length.

13. The method of claim 8, wherein each of the first, second, and third number of tabs includes a first bend in one direction and a second bend in an opposing direction.

14. The method of claim 8, wherein the 1-piece gasket includes two short sides, each of the short sides including a single tab, one of which is configured in an s shape, and two long sides, each long side including two independent tabs.

15. A system, comprising:
   a circuit enclosure; and
   a 1-piece gasket, the 1-piece gasket including a plurality of tabs for the 1-piece gasket, the plurality of tabs configured for securing the 1-piece gasket with an aperture, the 1-piece gasket formed from a single piece of material, wherein at least one of the tabs is configured in an s shape and at least one of the tabs is configured to have a portion substantially perpendicular to a sealing portion of the 1-piece gasket coupled to an approximately 90 degree bend coupled to a flat portion extending substantially parallel to the sealing portion of the 1-piece gasket coupled to a crimped portion.

16. The system of claim 15, wherein at least one of the tabs is crimped as a part of the s shape.

17. The system of claim 15, wherein the 1-piece gasket is configured to reduce electromagnetic interference (EMI) and air leakage.

18. The system of claim 15, wherein the 1-piece gasket is configured in a rectangular configuration.

19. The system of claim 15, wherein the 1-piece gasket includes a front sealing portion that includes a plurality of sides, each of the plurality of sides including a respective length that defines the length of the apparatus, each of the plurality of sides including a front portion that is substantially tint with a substantially uniform width along the entirety the respective length.

20. The system of claim 15, wherein each of the tabs includes a first bend in one direction and a second bend in an opposing direction.

* * * * *

UNITED STATES PATENT AND TRADEMARK OFFICE
CERTIFICATE OF CORRECTION

PATENT NO. : 7,723,621 B2  Page 1 of 1
APPLICATION NO. : 12/124670
DATED : May 25, 2010
INVENTOR(S) : George D. Megason et al.

It is certified that error appears in the above-identified patent and that said Letters Patent is hereby corrected as shown below:

In column 4, line 22, in Claim 1, delete "scaling" and insert -- sealing --, therefor, In column 6, line 28, in Claim 19, delete "tint" and insert -- flat --, therefor.

Signed and Sealed this

Seventeenth Day of August, 2010

David J. Kappos
*Director of the United States Patent and Trademark Office*